United States Patent [19]

Börner

[11] 4,286,842
[45] Sep. 1, 1981

[54] SOLID STATE CIRCUIT

[75] Inventor: Manfred Börner, Ulm, Fed. Rep. of Germany

[73] Assignee: Licentia Patent-Verwaltungs-G.m.b.H., Frankfurt am Main, Fed. Rep. of Germany

[21] Appl. No.: 722,416

[22] Filed: Sep. 13, 1976

[30] Foreign Application Priority Data

Sep. 13, 1975 [DE] Fed. Rep. of Germany ....... 2541003
Oct. 16, 1975 [DE] Fed. Rep. of Germany ....... 2546272

[51] Int. Cl.³ .............................................. G02F 1/133
[52] U.S. Cl. ................................................ 350/331 R
[58] Field of Search ................. 350/160 LC, 331, 332; 324/72, 73 R, 96, 153 R, 153 D, 153 T

[56] References Cited

PUBLICATIONS

Channin "Liquid-Crystal Technique for Observing Integrated-Circuit Operation", *IEEE Transactions on Electron Devices*, Oct. 1974, pp. 650-652, cited by applicant.
Keen: "Nondestructive Optical Technique for Electrically Testing Insulated-Gate Integrated Circuits," *Electronics Letters*, Jul. 29, 1971, vol. 17, pp. 432-433, cited by applicant.

*Primary Examiner*—Edward S. Bauer
*Attorney, Agent, or Firm*—Spencer & Kaye

[57] ABSTRACT

A solid state circuit which has a plurality of integrated circuit elements, each having at least a pair of connecting terminals. The operability of the individual elements is determined by providing an arrangement including an insulating layer on the solid state circuit, this insulating layer having arranged on it the pairs of terminals of the individual elements with the insulating layer insulating all of the terminals from each other. At least one further layer is arranged on the insulating layer and covers at least the respective pairs of terminals of the elements. This further layer has, at least in the region where it covers respective pairs of element terminals, optical characteristics which are selectively variable in dependence on the potential difference between the pairs of terminals of each respective element. The arrangement may be used as a picture producer, converter or amplifier.

24 Claims, 7 Drawing Figures

SOLID STATE CIRCUIT

BACKGROUND OF THE INVENTION

The present invention relates to a solid state circuit having a plurality of integrated circuit elements each having at least two output terminals, which solid state circuit is provided with means for determining the operability of each individual element.

Solid state circuits have recently been developed in which a very large number of individual elements are combined into a single component. One example of such an integrated circuit is a semiconductor memory device which contains several thousand individual memories each of which itself consists of a number of active and passive circuit elements which, as is conventional, are fashioned as bipolar elements or by so-called MOS manufacturing processes. Such relatively complicated devices require the use of a large number of complicated manufacturing steps, and experience has shown that, the state of the art being what it is, it is simply not possible to produce absolutely perfect integrated circuits, i.e., it is inevitable that at least some of the individual elements incorporated in the integrated circuit will not function in the desired manner. In fact, experience has shown that as the number of individual elements within an integrated circuit increases, the number of defective elements rises exponentially. It is, therefore, essential that various inspections be performed during, and particularly upon completion of, the manufacturing process, so as to select those integrated circuits which are suitable to carry out their intended function.

There exist testing procedures for integrated circuits having a large number of individual elements in which signals are applied to the circuit, or to individual elements, which signals are then evaluated electronically in order to allow the inspector to determine which of the completed integrated circuits are still usable. It will be appeciated that this is an expensive and cumbersome procedure, particularly in the case of integrated circuits incorporating a large number of individual elements.

SUMMARY OF THE INVENTION

It is, therefore, the primary object of the present invention, to overcome the above drawbacks, namely, to provide a way to simplify the inspection of integrated circuits having large numbers of individual elements, and with this object in view, the present invention resides in a solid state circuit of the above type, i.e., a circuit having a plurality of integrated circuit elements each having at least a pair of connecting terminals, which solid state circuit is equipped with means for determining the operability of the individual elements. These means comprise an insulating layer which is on the solid state circuit and which has arranged on it the pairs of terminals of the individual elements, this insulating layer insulating all of the terminals from each other. A further layer is arranged on the insulating layer and covers at least the pairs of terminals of the various elements, or at least the terminals of those elements which are to be tested. This further layer has, at least in the region where it covers the pairs of terminals of the elements to be inspected, optical characteristics which are selectively variable in dependence on the potential difference between the pair of terminals of each respective element.

By virtue of the above arrangement, defective elements can readily be ascertained simply by visually inspecting the surface of the solid state circuit, this being made possible by letting properly working elements emit a visual radiation, or at least by causing a visual emission to be brought about, while defective elements will appear as spots which are dark or otherwise do not emit light.

In accordance with another feature of the present invention, the above-described arrangement can be used as a picture producer, converter or amplifier.

DETAILED DESCRIPTION OF THE PREFERRED EMBODIMENTS

Figure 1:
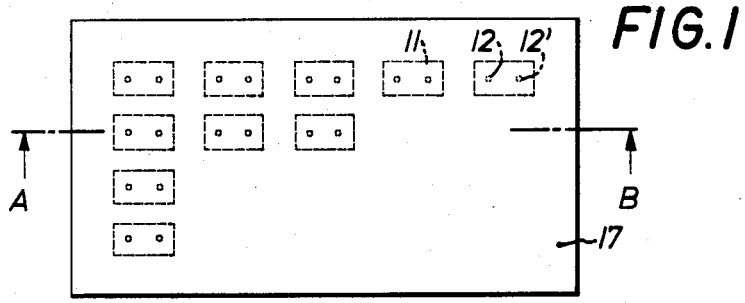
FIG. 1 is a plan view of a solid state circuit according to the present invention.
Figure 2:
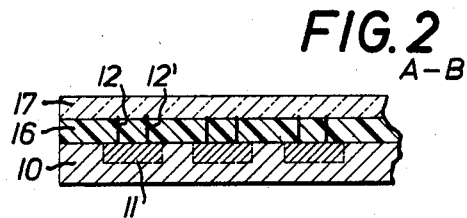
FIG. 2 is a sectional elevational view taken on line A-B of FIG. 1.

Referring now to the drawings and first to FIGS. 1 and 2 thereof, the same illustrate a solid state circuit 10 having a plurality of individual elements 11 which are shown as being arranged in a matrix pattern. Each element 11 has at least two poles connected to two connecting terminals 12, 12', the connecting terminals of all of the elements 11 being arranged on an insulating layer 16 of the solid state circuit such that the connecting terminals of all of the elements are galvanically insulated from each other. Neither the connections of the elements 11 to each other, nor their connection to external circuitry, are shown. Preferable substances for the layer 16 are $SiO_2$ or $Si_3N_4$.

According to one embodiment of the invention, the solid state integrated circuit 10 is in the form of a semiconductor memory having a plurality of individual memory elements 11 which are preferably in the form of bistable flip-flops, the same being constituted, in a manner well known in the art, by cross-coupled bipolar transistors or MOS transistors.

As mentioned above, the layer 16 serves galvanically to insulate the connection terminals from each other. In addition, the layer 16, which covers the solid state circuit, protects the elements 11 and reliably positions the connecting terminals, which, as illustrated, project through and terminate at the surface of the layer 16. Arranged on the layer 16 is a second layer 17 which overlies either all of the terminals or the pair of terminals 12, 12', of only those elements which are to be subjected to the visual inspection. The optical characteristics of the layer 17, at least in those regions thereof where it overlies the terminal pairs, are such as to be selectively variable in dependence on the potential difference between the respective terminal pairs 12, 12'.

In practice, the layer 17—hereinafter referred to as the optical layer—is in the form of a liquid crystal substance—for example biphenylderivates or carbonesters—whose light-diffusion characteristics are influenced by the electrical potential difference between the terminal pairs 12, 12'. This has the advantage that very little energy is required, because the optical indication can be brought about by light emitted from an external light source and impinging on the layer 17, i.e., the amount of light scattered by the layer 17 differs with differing potential differences to which the layer is exposed. A typical field intensity for producing this effect is $\approx 10^4/V/cm$.

Alternatively, the optical layer 17 can be one which, under the stimulation of a potential across the terminals 12, 12', emits an electroluminescence. A suitable substance for the layer 17 is Cu- or Mn-activatet ZnS.

According to a further feature of the present invention, the indication can be in the form of a double refraction of the liquid crystal brought about by an electric field, which double refraction can be made visible by means of an optical analyzer—see for example U.S. Pat. No. 3,551,028.

The function of a solid state circuit according to the present invention can be tested by applying to it the necessary operating voltage as well as the signal and/or clock pulse voltages to which the circuit will be subject in normal operation. This will cause certain potentials to appear across terminals connected to characteristic points of the elements 11, thus making it possible to determine the condition of each element 11 involved. That is to say, the instantaneous condition of each element 11 can be determined by observing any change in the optical characteristic of the layer 17, thus making it easy to determine whether or not any given element 11 is in proper operating condition.

In order to avoid erroneous indications resulting from cross-over effect between adjacent elements 11, particularly if these elements are arranged, as mentioned above, in a matrix-like pattern, it is advisable to let the distance between adjacent elements 11 be greater than the distance between the two terminals of any given pair of terminals 12, 12'.

Figure 3:
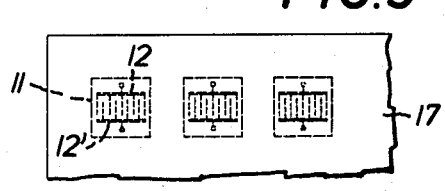
FIG. 3 shows a preferred arrangement of the connecting terminals of the individual elements.

According to yet another feature of the invention, the two terminals 12, 12', of any one element have, as shown in FIG. 3, fingers forming a comb-like configuration, the terminals of each pair being oriented with respect to each other such that fingers of one terminal extend between fingers of the other. Thanks to such an arrangement, the effect of the potential difference between the two terminals is concentrated and localized, so that only that portion of the optical layer 17 which is in the immediate vicinity of the two terminals will have its optical characteristics influenced by the potential difference between the two terminals. This, in turn, increases the readability of the indication.

Figure 4:
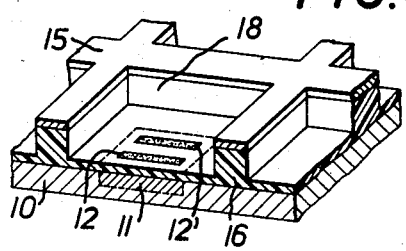
FIG. 4 is a perspective view, partly in section, showing how the connecting terminals may be embedded in the insulating layer.

According to another feature of the present invention, the terminals 12, 12', are embedded in the insulating layer 16, as shown in FIG. 4. Here, the layer 16 is provided with a plurality of recesses, each extended down as far as a respective pair of terminals such that at least part of each terminal is not covered by the insulating layer. The optical layer, i.e., the layer whose optical characteristics are selectively variable by the potential difference across the terminals is not shown in FIG. 4, but it has individual segments located in the recesses which overlie the parts of the pair of terminals left uncovered by the insulating layer 16. This arrangement, providing as it does a wall of insulation between the individual segments of the optical layer, provides particularly good protection against the above-mentioned cross-over effect, but in order even further to decrease the possibility of an erroneous indication resulting from cross-over, the surface of the insulating layer 16 which is directed away from the terminals—this being the upper surface as viewed in FIG. 4—is covered by a third layer 15 which is itself a good conductor of electricity and which is connected to a reference potential. This reference potential should be one that is different from the potential of the terminals, and can in practice be the ground potential.

Figure 5:
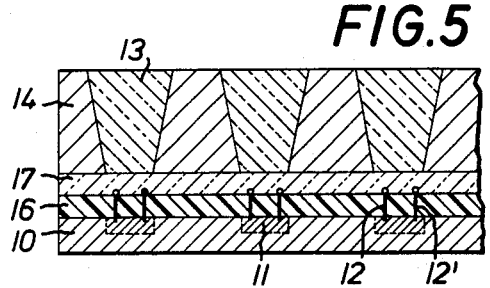
FIG. 5 is a sectional elevational view similar to FIG. 2 but showing the solid state circuit equipped with light conductors.

According to still another feature of the present invention, the information obtained by variation in the light-emitting characteristics of the optical layer can be made to be visible on an enlarged surface area, thus allowing the visual inspection to be carried out from a greater distance. Such an arrangement is shown in FIG. 5, which shows a solid state circuit similar to that of FIG. 2 but additionally provided with a plurality of frusto-conical light conductors 13 which are embedded in a further layer 14 made of an opaque, electrically non-conductive material. Each of the light conductors 13 is associated with a respective pair of terminals, the arrangement being such that the smaller end face of each light conductor is directed toward its respective pair of terminals.

According to still another feature of the present invention, the solid state circuit equipped with the above described function testing means can be used as a picture producer or indicating device for presenting information, or picture converter or amplifier. This can be done by letting each element 11 whose terminals 12, 12', are covered by an optical layer such as the above-described layer 17 serve as a means for creating an image point, and by appropriately activating each such element 11 to form the desired picture. By illuminating the layer 17 with a monochromatic external light source, as would suffice if the device is used solely to test the elements 11, a black-and-white or other two-color picture is obtained, whereas if the device is illuminated by a multichromatic light source, a color picture can be obtained.

This may be easily achieved, for example, by subsequently switching three light sources of different colors, for example red, green, blue. The brightness of the different colors depends on the respective voltages, applied to the liquid crystal cells during the intervals in which the light sources are switched on.

Driver circuits in the form of a matrix for driving the device as a display are well known, for example see IEEE Conf. Rec. 1972 Conf. Display Devices, New York 1972 or U.S. Pat. No. 3,614,769.

Under certain circumstances, the terminals 12, 12', may be connected to their respective elements 11 via disconnect and/or amplifier stages. Such stages are useful when the electric potential obtainable from an element is not sufficient to influence the optical layer 17, and/or to prevent any undesired feedback between the terminals 12, 12', and the associated element 11. These disconnect or amplifier stages can, in practice, be part of the integrated circuit arrangement.

Figure 6:
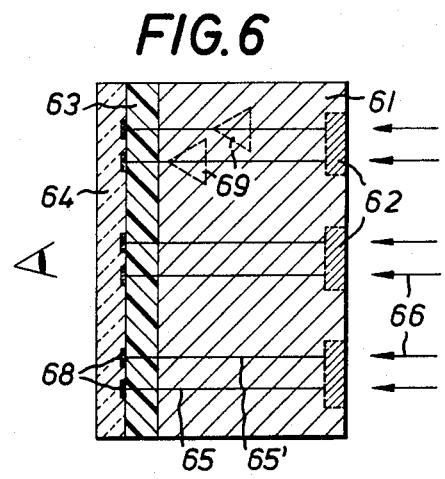
FIG. 6 is a sectional view showing a solid state circuit equipped with radiation-sensitive elements.
Figure 7:
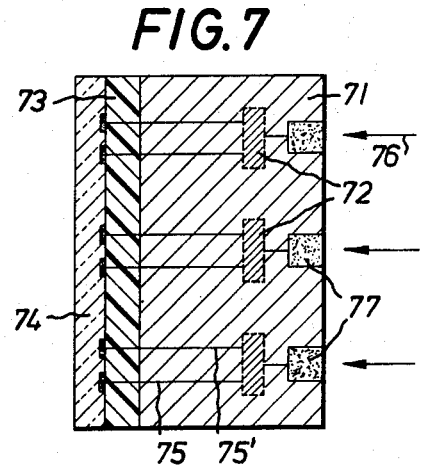
FIG. 7 is a sectional view showing a solid state circuit equipped with supplemental radiation-sensitive receiving elements.

According to still another feature of the present invention, the elements connected to the terminal pairs can themselves be sensitive to light or other radiation, or they can be connected to separate respective light or radiation sensitive elements. This is shown in FIGS. 6 and 7, respectively. In FIG. 6, the elements 62 forming part of the solid state circuit 61 are themselves light or radiation sensitive and are connected, via leads 65, 65' which pass through the insulating layer 63 to terminals 68 covered by the optical layer 64. If desired, amplifiers 69 may be provided. The radiation impinging on the elements 62 is shown schematically at 66. In FIG. 7, the solid state circuit 71 contains elements 72 whose leads 75, 75' pass through the insulating layer 73 and end at the optical layer 74. Here, the radiation 76 impinges upon radiation-sensitive elements 77 which are connected to respective ones of the elements 72. In FIGS. 6 and 7, the elements 62, 77, may be of a type having the characteristics of a photodiode or photoresistor which converts the incoming radiation into an appropriate electrical signal.

As stated above, the arrangement can be used as an image amplifier, in that relatively weak radiation 66, 76 can be suitably amplified to produce a visible picture on the optical layer 64, 74. Moreover, the arrangement can be used as an image converter, in that the radiation-sensitive elements 62, 77 may be of a type adapted to respond to radiation or light not visible to the human eye. Nonetheless, the signals ultimately reaching the connecting terminals will affect the optical layer 64, 74, so as to produce an image that is visible to the human eye.

It will be understood that the above description of the present invention is susceptible to various modifications, changes and adaptations, and the same are intended to be comprehended within the meaning and range of equivalents of the appended claims.

What is claimed is:

1. In combination with a solid state circuit which has a plurality of integrated circuit elements each having at least a pair of connecting terminals, means for determining the operability of said elements, said means comprising
   (a) means forming a first, insulating layer on said solid state circuit and having arranged on it the pairs of terminals of said elements, said insulating layer insulating all of the terminals from each other; and
   (b) means forming at least one second layer arranged on said insulating layer and covering at least the respective pairs of terminals of said elements, said second layer having, at least in the regions where it covers respective pairs of element terminals, optical characteristics which are selectively variable in dependence on the potential difference between the pair of terminals of each respective element.

2. The combination defined in claim 1, wherein said integrated circuit elements are arranged in a matrix pattern.

3. The combination defined in claim 1, wherein said pairs of terminals are embedded in said insulating layer, the latter being provided with a plurality of recesses extending to said terminals.

4. The combination defined in claim 3, wherein each individual recess extends to a respective pair of terminals such that at least part of each terminal is left uncovered by said insulating layer.

5. The combination defined in claim 4, wherein said second layer has individual segments which have said potential difference dependent optical characteristics, said segments being located in said recesses and covering the parts of the pair of terminals left uncovered by said insulating layer.

6. The combination defined in claim 3, wherein that surface of said insulating layer which is directed away from said terminals is covered by a third layer which is a good conductor of electricity.

7. The combination defined in claim 6, wherein said third layer is connected to a reference potential which is different from the potential of said terminals.

8. The combination defined in claim 1, wherein said terminals have fingers forming a comb-like configuration, the terminals of each respective pair being oriented with respect to each other such that fingers of one terminal extend between fingers of the other.

9. The combination defined in claim 1, wherein electronic stages are interposed between said terminals and the respective elements with which they are associated.

10. The combination defined in claim 9, wherein said stages are disconnect stages.

11. The combination defined in claim 9, wherein said stages are amplifier stages.

12. The combination defined in claim 1, wherein said second layer is a liquid crystal layer.

13. The combination defined in claim 12, wherein external means are provided for illuminating said second layer.

14. The combination defined in claim 13, wherein said external means illuminate said second layer monochromatically.

15. The combination defined in claim 13, wherein said external means illuminate said second layer multichromatically.

16. The combination defined in claim 1, wherein said second layer is an electroluminescent layer.

17. The combination defined in claim 1, further comprising a plurality of frusto-conical light conductors each associated with a respective pair of terminals, each light conductor being associated with said solid state circuit such that the smaller end face of each light conductor is directed toward its respective pair of terminals.

18. The combination defined in claim 1, wherein said elements are light-sensitive.

19. The combination defined in claim 1, wherein said solid state circuit is further provided with a plurality of light-sensitive elements connected to respective ones of said first-mentioned elements.

20. An indicating device for representing information, comprising a solid state circuit which has a plurality of integrated circuit elements each having at least a pair of connecting terminals, and means for activating each of said elements, said means comprising
   (a) means forming a first, insulating layer on said solid state circuit and having arranged on it the pairs of terminals of said elements, said insulating layer insulating all of the terminals from each other; and
   (b) means forming at least one second layer arranged on said insulating layer and covering at least the respective pairs of terminals of said elements, said second layer having, at least in the regions where it covers respective pairs of element terminals, optical characteristics which are selectively variable in dependence on the potential difference between the pair of terminals of each respective element.

21. A picture converter comprising a solid state circuit which has a plurality of light-sensitive integrated circuit elements each having at least a pair of connecting terminals, and means for providing an indication of the impingement of light on each of said elements, said means comprising
   (a) means forming a first, insulating layer on said solid state circuit and having arranged on it the pairs of terminals of said elements, said insulating layer insulating all of the terminals from each other; and (b) means forming at least one second layer arranged on said insulating layer and covering at least the respective pair of terminals of said elements, said second layer having, at least in the regions where it covers respective pairs of element terminals, optical characteristics which are selectively variable in dependence on the potential difference between the pair of terminals of each respective element.

22. A picture amplifier comprising a solid state circuit which has a plurality of light-sensitive integrated circuit elements each having at least a pair of connecting terminals, and means for providing an indication of the impingement of light on each of said elements, said means comprising
   (a) means forming a first, insulating layer on said solid state circuit and having arranged on it the pairs of terminals of said elements, said insulating layer insulating all of the terminals from each other; and
   (b) means forming at least one second layer arranged on said insulating layer and covering at least the respective pairs of terminals of said elements, said second layer having, at least in the regions where it covers respective pairs of element terminals, optical characteristics which are selectively variable in dependence on the potential difference between the pair of terminals of each respective element.

23. A picture converter comprising a solid state circuit which has a plurality of integrated circuit elements each having at least a pair of connecting terminals and a plurality of light-sensitive elements connected to respective ones of said integrated circuit elements, and means for providing an indication of the impingement of light on each of said light-sensitive elements, said means comprising
   (a) means forming a first, insulating layer on said solid state circuit and having arranged on it the pairs of terminals of said integrated circuit elements, said insulating layer insulating all of the terminals from each other; and
   (b) means forming at least one second layer arranged on said insulating layer and covering at least the respective pairs of terminals of said integrated circuit elements, said second layer having, at least in the regions where it covers respective pairs of element terminals, optical characteristics which are selectively variable in dependence on the potential difference between the pair of terminals of each respective integrated circuit element.

24. A picture amplifier comprising a solid state circuit which has a plurality of integrated circuit elements each having at least a pair of connecting terminals, and a plurality of light-sensitive elements connected to respective ones of said integrated circuit elements, and means for providing an indication of the impingement of light on each of said light-sensitive elements; said means comprising
   (a) means forming a first, insulating layer on said solid state circuit and having arranged on it the pairs of terminals of said integrated circuit elements, said insulating layer insulating all of the terminals from each other; and
   (b) means forming at least one second layer arranged on said insulating layer and covering at least the respective pairs of terminals of said integrated circuit elements, said second layer having, at least in the regions where it covers respective pairs of element terminals, optical characteristics which are selectively variable in dependence on the potential difference between the pair of terminals of each respective integrated circuit element.

* * * * *